(12) United States Patent
Pikus

(10) Patent No.: US 10,311,197 B2
(45) Date of Patent: Jun. 4, 2019

(54) PRESERVING HIERARCHY AND COLORING UNIFORMITY IN MULTI-PATTERNING LAYOUT DESIGN

(71) Applicant: Mentor Graphics Corporation, Wilsonville, OR (US)

(72) Inventor: Fedor G Pikus, Beaverton, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 15/050,447

(22) Filed: Feb. 22, 2016

(65) Prior Publication Data

US 2017/0242953 A1    Aug. 24, 2017

(51) Int. Cl.
*G06F 17/50* (2006.01)

(52) U.S. Cl.
CPC ...... *G06F 17/5081* (2013.01); *G06F 17/5045* (2013.01); *G06F 17/5068* (2013.01); *G06F 17/5072* (2013.01)

(58) Field of Classification Search
CPC ............. G06F 17/5068; G06F 17/5045; G06F 17/5072; G06F 17/5081
See application file for complete search history.

(56) References Cited

U.S. PATENT DOCUMENTS

| | | | | |
|---|---|---|---|---|
| 7,831,942 | B1 * | 11/2010 | Gennari | G06F 17/5068 430/30 |
| 8,560,998 | B1 * | 10/2013 | Salowe | H01L 27/0207 716/126 |
| 9,165,104 | B1 * | 10/2015 | Wang | G06F 17/5081 |
| 2004/0153988 | A1 * | 8/2004 | Ito | G06F 17/5068 716/112 |
| 2013/0061183 | A1 * | 3/2013 | Abou Ghaida | G06F 17/5068 716/52 |
| 2013/0061184 | A1 * | 3/2013 | Guo | G03F 1/70 716/52 |
| 2015/0040082 | A1 * | 2/2015 | Huang | G03F 1/70 716/55 |
| 2015/0286770 | A1 * | 10/2015 | Morishita | G06F 17/5081 716/112 |

* cited by examiner

*Primary Examiner* — Stacy Whitmore

(57) ABSTRACT

Layout design data is seeded with sampling markers. The sampling markers are used to determine patterning scores for patterning clusters in the layout design data, such that a patterning score corresponds to a particular coloring arrangement, and the value of a patterning score corresponds to how many of the sampling markers have a given color. Coloring arrangements are then applied to the patterning clusters based upon the patterning scores.

20 Claims, 11 Drawing Sheets

PRESERVING HIERARCHY AND COLORING UNIFORMITY IN MULTI-PATTERNING LAYOUT DESIGN

FIELD OF THE TECHNOLOGY

The disclosed technology is directed techniques for determining coloring schemes for patterning clusters in a multiple-patterning scheme for layout design data. Various implementations of the disclosed technology may be particularly useful for improving uniformity of coloring arrangements across multiple instances of hierarchical cells, while preserving the hierarchical information of those cells.

BACKGROUND

Electronic circuits, such as integrated microcircuits, are used in a variety of products, from automobiles to microwaves to personal computers. Designing and fabricating microcircuit devices typically involves many steps, known as a "design flow." The particular steps of a design flow often are dependent upon the type of microcircuit being designed, its complexity, the design team, and the microcircuit fabricator or foundry that will manufacture the microcircuit. Typically, software and hardware "tools" will verify a design at various stages of the design flow by running software simulators and/or hardware emulators, and errors in the design are corrected.

Several steps are common to most design flows. Initially, the specification for the new microcircuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that the logic incorporated into the design will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This logical generally corresponds to the level of representation displayed in conventional circuit diagrams. Preliminary timing estimates for portions of the circuit may be made at this stage, using an assumed characteristic speed for each device. In addition, the relationships between the electronic devices are analyzed, to confirm that the circuit described by the device design will correctly perform the functions desired for the circuit. This analysis is sometimes referred to as "formal verification."

Once the relationships between circuit devices have been established, the design is again transformed, this time into a physical design that describes specific geometric elements. This type of design often is referred to as a "layout" design. The geometric elements define the shapes that will be created in various materials to actually manufacture the circuit device components (e.g., contacts, channels, gates, etc.) making up the circuit. While the geometric elements are typically polygons, other shapes, such as circular and elliptical shapes, may be employed. These geometric elements may be custom designed, selected from a library of previously-created designs, or some combination of both. Geometric elements also are added to form the connection lines that will interconnect these circuit devices. Layout tools (often referred to as "place and route" tools), such as IC Station available from Mentor Graphics® Corporation of Wilsonville, Oreg. or Virtuoso available from Cadence® Design Systems of San Jose, Calif., are commonly used for both of these tasks.

With a layout design, each physical layer of the microcircuit will have a corresponding layer representation in the layout design data, and the geometric elements described in a layer representation will define the relative locations of the circuit device components that will make up a circuit device. Thus, the geometric elements in the representation of an implant layer will define the regions where doping will occur, while the geometric elements in the representation of a metal layer may define the locations in a metal layer where conductive wires will be formed to connect the circuit devices. Typically, a designer will perform a number of analyses on the layout design. For example, the layout design may be analyzed to confirm that it accurately represents the circuit devices and their relationships described in the device design. The layout design also may be analyzed to confirm that it complies with various design requirements, such as minimum spacings between geometric elements. Still further, it may be modified to include the use of redundant or other compensatory geometric elements intended to counteract limitations in the manufacturing process, etc. This analysis is sometimes referred to as "physical verification."

After the layout design has been finalized, then it is converted into a format that can be employed by a mask or reticle writing tool to create a mask or reticle for use in a photolithographic manufacturing process. Masks and reticles are typically made using tools that expose a blank reticle to an electron or laser beam. Most mask writing tools are able to only "write" certain kinds of polygons, however, such as right triangles, rectangles or other trapezoids. Moreover, the sizes of the polygons are limited physically by the maximum beam aperture size available to the tool. Accordingly, larger geometric elements in the layout design, or geometric elements that are not basic right triangles, rectangles or trapezoids (which typically is a majority of the geometric elements in a layout design) must be "fractured" into the smaller, more basic polygons that can be written by the mask or reticle writing tool.

Once the layout design has been fractured, then the layout design data can be converted to a format compatible with the mask or reticle writing tool. Examples of such formats are MEBES, for raster scanning machines manufactured by ETEC, an Applied Materials Company, the ".MIC" format from Micronics AB in Sweden, and various vector scan formats for Nuflare, JEOL, and Hitachi machines, such as VSB12 or VSB12. The written masks or reticles can then be used in a photolithographic process to expose selected areas of a wafer in order to produce the desired integrated circuit devices on the wafer.

To meet the demand for more powerful microdevices, designers have regularly increased the average density of their structures. For example, the area of an integrated circuit that might once have contained 100 transistors may now be required to contain 1,000 or even 10,000 transistors. Some current microdevice designs call for microdevice structures to be packed so closely that it may be difficult to properly manufacture adjacent structures in a single lithographic process. For example, a current microcircuit design may specify a series of parallel conductive lines positioned so closely that a conventional mask writer cannot resolve the pitch between the lines.

To address this issue, the structures in a layer of a microcircuit device are now sometimes formed using two or more separate lithographic processes. This technique, referred to as "double patterning," partitions a layout design into two or more groups or "colors," each of which is then used to form a complementary lithographic mask pattern. Thus, if a layout design calls for a series of closely-spaced parallel connective lines, this target pattern may be partitioned so that adjacent lines are actually formed by different masks in separate lithographic processes.

While double patterning lithographic techniques allow for denser microdevice structures, it is sometimes difficult to implement these techniques. For example, it may difficult to determine when the geometric elements described in layout design data (corresponding to the physical structures of the microdevice) can be correctly partitioned into two complementary sets of layout design data without creating a conflict (i.e., a situation where two or more adjacent geometric elements are too close to be formed by the same lithographic mask, but are nonetheless scheduled to be formed by the same lithographic mask).

SUMMARY

While double-patterning, triple-patterning, and higher multiple patterning provide techniques for creating microdevices with dense structures, it is sometimes useful to apply constraints on how these techniques are applied. For example, a designer may create a hierarchical cell that has many instances throughout layout design data. Further, the designer may prefer that all of the instances of these cells share the same coloring arrangement, so that the structures formed by these cells have similar operating characteristics after manufacturing. A conventional double-patterning technique may assign different coloring arrangements to these cell instances, without consideration of the preference to maintain a uniform coloring arrangement across them. Still further, the process of assigning coloring arrangements may require promotion of geometric elements from within the instances, removing the hierarchical information associated with the cell instances.

As will be explained in more detail below, various implementations of the disclosed technology help preserve uniformity for multiple instances of hierarchical cells for double and multiple patterning techniques. Initially, layout design data is seeded with sampling markers. The sampling markers are used to determine patterning scores for patterning clusters in the layout design data, such that a patterning score corresponds to a particular coloring arrangement, and the value of a patterning score corresponds to how many of the sampling markers have a given (e.g., a preferred) color. Coloring arrangements are then applied to the patterning clusters based upon the patterning scores.

DETAILED DESCRIPTION

Illustrative Operating Environment

The execution of various electronic design automation processes described herein may be implemented using computer-executable software instructions executed by one or more programmable computing devices. Because these processes may be implemented using software instructions, the components and operation of a generic programmable computer system on which various embodiments of these processes may be employed will first be described. Further, because of the complexity of some electronic design automation processes and the large size of many circuit designs, various electronic design automation tools are configured to operate on a computing system capable of simultaneously running multiple processing threads. The components and operation of a computer system having a host or master computer and one or more remote or slave computers therefore will be described with reference to FIG. 1. This operating environment is only one example of a suitable operating environment, however, and is not intended to suggest any limitation as to the scope of use or functionality of any implementations of the invention.

Figure 1:
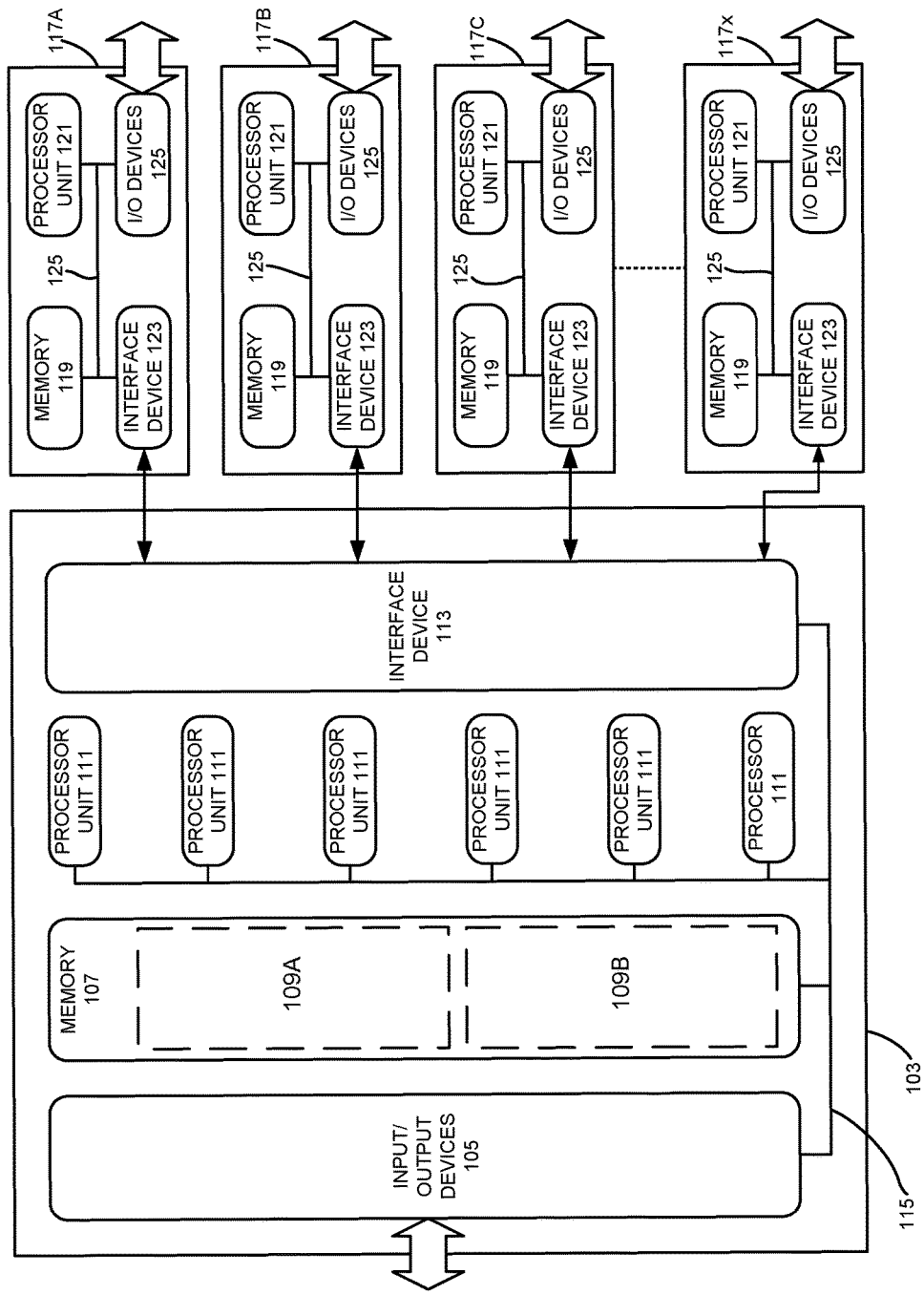
FIGS. 1 and 2 illustrate components of a computer system that may be used to implement various embodiments of the disclosed technology.

In FIG. 1, the computer system 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other non-transitory storage medium that can be used to store desired information. As used herein, the term "non-transitory" refers to the ability to store information for subsequent retrieval at a desired time, as opposed to propagating electromagnetic signals.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
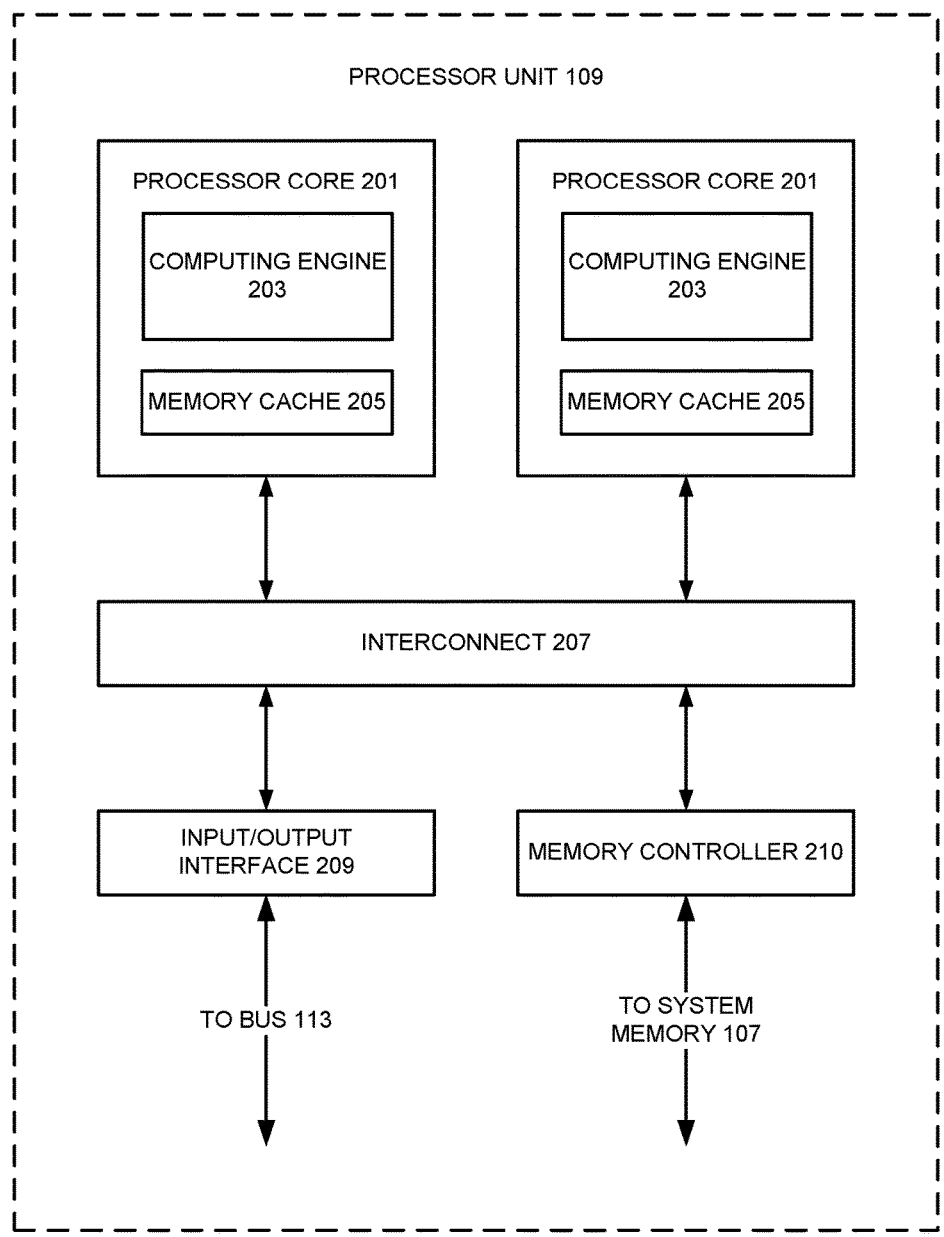

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interfaces 209 and a memory controller 211. The input/output interface 209 provides a communication interface between the processor unit 201 and the bus 115. Similarly, the memory controller 211 controls the exchange of information between the processor unit 201 and the system memory 107. With some implementations of the invention, the processor units 201 may include additional components, such as a high-level cache memory accessible shared by the processor cores 201.

While FIG. 2 shows one illustration of a processor unit 201 that may be employed by some embodiments of the invention, it should be appreciated that this illustration is representative only, and is not intended to be limiting. It also should be appreciated that, with some implementations, a multi-core processor unit 111 can be used in lieu of multiple, separate processor units 111. For example, rather than employing six separate processor units 111, an alternate implementation of the computing system 101 may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the slave computers 117A, 1157, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the slave computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each slave computer 117 may include a memory 119, a processor unit 121, an interface device 122, and, optionally, one more input/output devices 125 connected together by a system bus 127. As with the master computer 103, the optional input/output devices 125 for the slave computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. The memory 119 then may be implemented using any combination of the computer readable media discussed above. Like the interface device 113, the interface devices 123 allow the slave computers 117 to communicate with the master computer 103 over the communication interface.

In the illustrated example, the master computer 103 is a multi-processor unit computer with multiple processor units 111, while each slave computer 117 has a single processor unit 121. It should be noted, however, that alternate implementations of the technology may employ a master computer having single processor unit 111. Further, one or more of the slave computers 117 may have multiple processor units 121, depending upon their intended use, as previously discussed. Also, while only a single interface device 113 or 123 is illustrated for both the master computer 103 and the slave computers, it should be noted that, with alternate embodiments of the invention, either the computer 103, one or more of the slave computers 117, or some combination of both may use two or more different interface devices 113 or 123 for communicating over multiple communication interfaces.

With various examples of the computer system 101, the master computer 103 may be connected to one or more external data storage devices. These external data storage devices may be implemented using any combination of non-transitory computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the computer system 101, one or more of the slave computers 117 may alternately or additions be connected to one or more external non-transitory data storage devices. Typically, these external non-transitory data storage devices will include data storage devices that also are connected to the master computer 103, but they also may be different from any data storage devices accessible by the master computer 103.

It also should be appreciated that the description of the computer system 101 illustrated in FIG. 1 and FIG. 2 is provided as an example only, and it not intended to suggest any limitation as to the scope of use or functionality of various embodiments of the invention.

Organization of Layout Design Data

As used herein, the term "design" is intended to encompass data describing an entire microdevice, such as an integrated circuit device or micro-electromechanical system (MEMS) device. This term also is intended to encompass a smaller group of data describing one or more components of an entire microdevice, however, such as a layer of an integrated circuit device, or even a portion of a layer of an integrated circuit device. Still further, the term "design" also is intended to encompass data describing more than one microdevice, such as data to be used to create a mask or reticle for simultaneously forming multiple microdevices on a single wafer. The layout design data may be in any desired format, such as, for example, the Graphic Data System II (GDSII) data format or the Open Artwork System Interchange Standard (OASIS) data format proposed by Semiconductor Equipment and Materials International (SEMI). Other formats include an open source format named Open Access, Milkyway by Synopsys, Inc., and EDDM by Mentor Graphics, Inc.

The design of a new integrated circuit may include the interconnection of millions of transistors, resistors, capacitors, or other electrical structures into logic circuits, memory circuits, programmable field arrays, and other circuit devices. In order to allow a computer to more easily create and analyze these large data structures (and to allow human users to better understand these data structures), they are often hierarchically organized into smaller data structures, typically referred to as "cells." Thus, for a microprocessor or flash memory design, all of the transistors making up a memory circuit for storing a single bit may be categorized into a single "bit memory" cell. Rather than having to enumerate each transistor individually in the design, the group of transistors making up a single-bit memory circuit can thus collectively be referred to and manipulated as a single unit. Similarly, the design data describing a larger 16-bit memory register circuit can be categorized into a single cell. This higher level "register cell" might then include sixteen bit memory cells, together with the design data describing other miscellaneous circuitry, such as an input/output circuit for transferring data into and out of each of the bit memory cells. Similarly, the design data describing a 128 kB memory array can then be concisely described as a combination of only 64,000 register cells, together with the design data describing its own miscellaneous circuitry, such as an input/output circuit for transferring data into and out of each of the register cells. Of course, while the above-described example is of design data organized hierarchically based upon circuit structures, circuit design data may alternately or additionally be organized hierarchically according to any desired criteria including, for example, a geographic grid of regular or arbitrary dimensions (e.g., windows), a memory amount available for performing operations on the design data, design element density, etc.

Double and Multiple Patterning

Because of the structural density of conventional integrated circuits, a single physical layer of an integrated circuit device is now sometimes formed using two or more separate masks during a lithographic manufacturing process. For example, the geometric elements in layout design data representing a physical layer of an integrated circuit may be partitioned into two or more groups or "colors," each of which is then used to form a complementary lithographic mask. Thus, if a layout design calls for a series of closely-spaced parallel connective lines, this target pattern may be partitioned so that adjacent lines are actually formed by different masks in separate lithographic processes. This technique is referred to as "double patterning." Similarly, techniques that divide a physical layer into three sets of geometric elements, each of which is then used to form a complementary lithographic mask pattern, is referred to a "triple patterning." In general, the use two, three, four, or even more complementary masks (and complementary sets of geometric elements) are sometimes commonly referred to as multiple patterning.

Figure 3A:
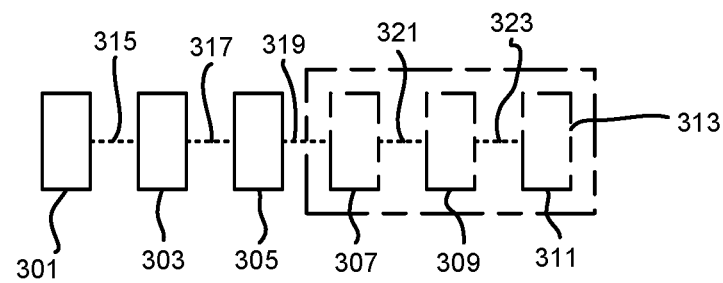
FIGS. 3A-3C illustrate the use of constraints to determine respective placement of geometric elements for complementary using a double-patterning technique.
Figure 3B:
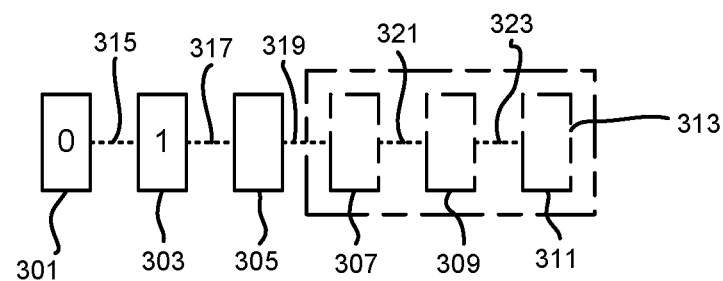

For example, FIG. 3A illustrates geometric elements 301-311, of which geometric elements 307-311 are placed within a hierarchical cell 313. In this example, the geometric elements are placed with constraints (sometimes referred to as a "separation directives") that direct geometric elements placed too closely to each other to be assigned to different lithographic masks. For example, the mask assignments of polygons 301 and 303 are controlled by a constraint 315. The constraint 315 requires that, if geometric element 301 is assigned to one mask (for example, "colored" with a value of "0"), then geometric element 303 should be assigned to another mask (for example, "colored" with a value of "1"), as shown in FIG. 3B. With various implementations of this technology, the color of a geometric element can be designated by a variety of techniques. For example, with double-patterning, a single bit associated with a geometric element can be used to designate that geometric element as being colored "0" or being colored "1."

Figure 3C:
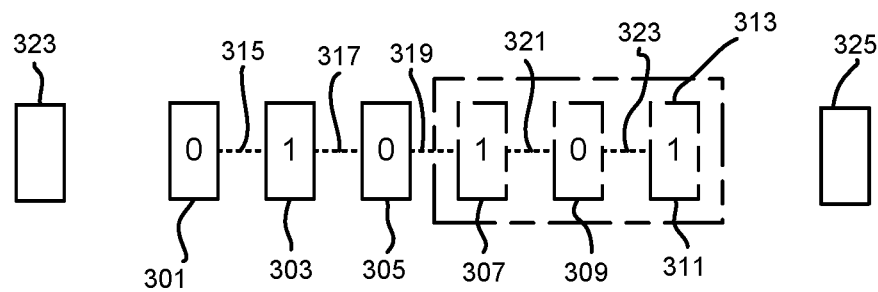

Likewise, the mask assignments of polygons 303 and 305 are controlled by a constraint 317. The constraint 317 requires that, if geometric element 303 is assigned to one mask (for example, "colored" with a value of "1", as previously noted), then geometric element 305 should be assigned to another mask (for example, "colored" with a value of "0"), as shown in FIG. 3C. Constraints 319-323 then direct the mask assignments of polygons 307-311, respectively, as shown in FIG. 3C. As seen in this figure, while geometric elements 307-311 are contained within a cell that may have many placements throughout a layout design, the mask assignment or "coloring" of these geometric elements are constrained by the local placement of geometric elements outside of the cell. Further, as seen from FIGS. 3A-3C, the geometric elements 301-311 may be seen as being "interconnected" by their constraints 315-323. A set of geometric elements interconnected by coloring constraints will be referred to herein as a patterning cluster. Geometric elements 323 and 325, shown in FIG. 3C, have no constraint relationship with any of geometric elements 307-311, and thus are not part of the patterning cluster formed by geometric elements 301-311.

Figure 4:
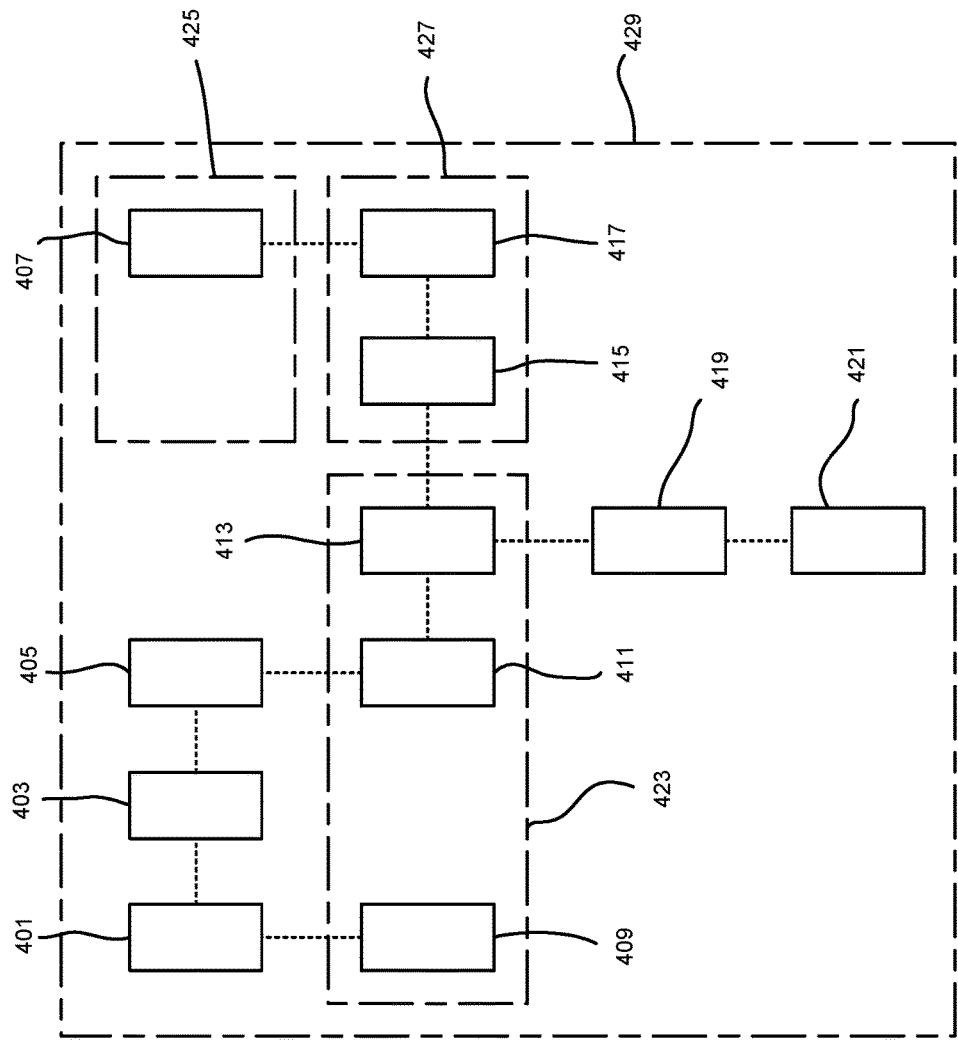
FIG. 4 illustrates an example of a patterning cluster that extends through multiple hierarchical cells.

FIG. 4 illustrates an example of a patterning cluster that extends through multiple hierarchical cells. More particularly, this figure shows geometric elements 401-421. Of these, geometric element 407 is placed in hierarchical cell 425, geometric elements 409-413 are placed in hierarchical cell 423, and geometric elements 415 and 417 are placed in hierarchical cell 427. All of the geometric elements 401-421 (and the hierarchical cells 423-427) are placed within the higher level hierarchical cell 429. As seen in this figure, all of the geometric elements 401-421 are associated together, either directly or indirectly, by constraints (shown in FIG. 4 by dotted lines) into a single patterning cluster. Within hierarchical cell 423, however, geometric elements 411 and 413 are directly associated by a constraint, but neither of geometric elements 411 and 413 is associated with geometric element 409 by a constraint within the cell. Thus, when considering hierarchical cell 409 by itself, it appears to contain two patterning clusters: a first cluster made up of geometric element 409 alone, and a second cluster made up of geometric elements 411 and 413. As discussed herein, this type of partial patterning cluster, which appears to be an isolated cluster when viewed within a single hierarchical cell, but which is part of a larger cluster when considered within a higher hierarchical cell, will be referred to as a patterning cluster portion. Thus, hierarchical cell 423 includes two patterning cluster portions (made up of geometric element 409 and geometric elements 411 and 413), hierarchical cell 425 includes a single patterning cluster portion made up of geometric element 407, and hierarchical cell 427 includes a single patterning cluster portion made up of geometric elements 415 and 417. The higher-level hierarchical cell 429 then includes the entire patterning cluster.

Coloring Selection Tool

Figure 5:
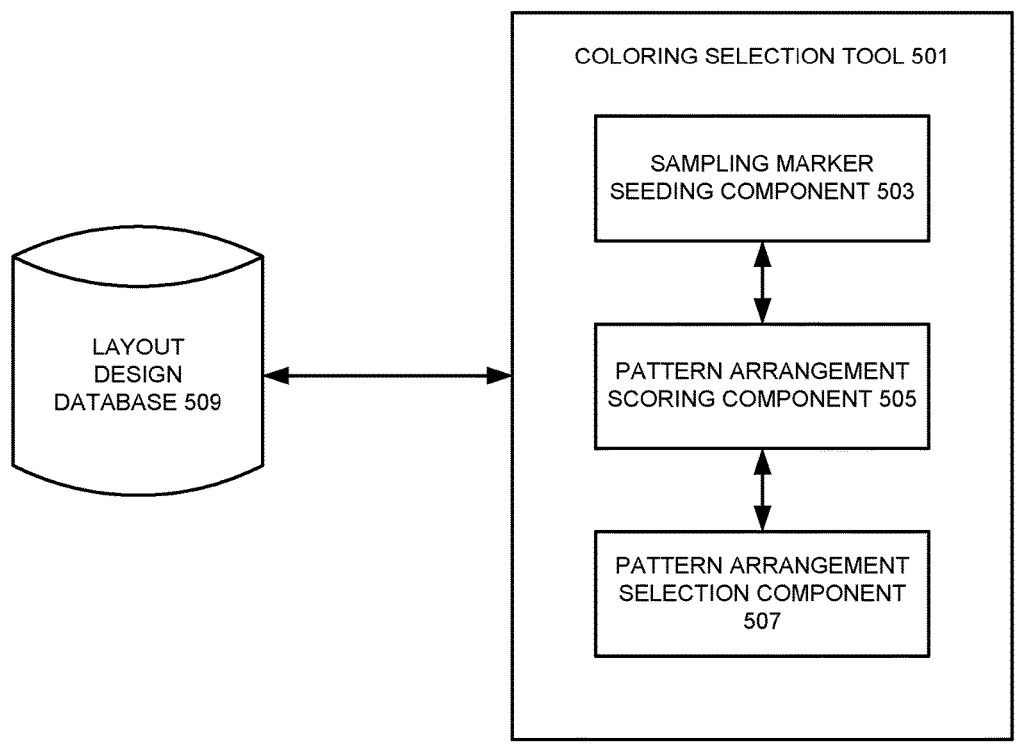
FIG. 5 illustrates an example of a coloring selection tool that may be employed to select coloring arrangements in a layout design.

FIG. 5 illustrates an example of a coloring selection tool 501 that may be employed to select coloring arrangements in a layout design. As seen in this figure, the coloring selection tool 501 includes a sampling marker seeding component 503, a pattern arrangement scoring component 505, and a pattern arrangement selection component 507. As will be explained in more detail below, the sampling marker seeding component 503 seeds layout design data with sampling markers. The pattern arrangement scoring component 505 uses the sampling markers to determine patterning scores for patterning clusters in the layout design data, such that a patterning score corresponds to a particular coloring arrangement. The pattern arrangement selection component then applies coloring arrangements to the patterning clusters based upon the patterning scores.

Various examples of the sampling marker seeding component 503, pattern arrangement scoring component 505, and pattern arrangement selection component 507 may be embodied by a single or multiprocessor computing system, such as the computing system 101 illustrated in FIG. 1. Accordingly, one or more elements of each of the sampling marker seeding component 503, the pattern arrangement scoring component 505, and the pattern arrangement selection component 507 may be embodied using one or more processors in a multiprocessor computing system's master computer, such as the master computer 103, one or more servant computers in a multiprocessor computing system, such as the servant computers 117, or some combination of both executing the appropriate software instructions. Of course, some examples of the coloring selection tool 501 may be implemented by, for example, one or more computer-readable devices having such software instructions stored thereon in a non-transitory manner, that is, stored over a period of time such that they may be retrieved for use at any arbitrary point during that period of time. It also should be appreciated that, while the sampling marker seeding component 503, the pattern arrangement scoring component 505, and the pattern arrangement selection component 507 are shown as separate units in FIG. 5, a single servant computer (or a single processor within a master computer) may be used to embody two or all three of these components at different times, or aspects of two or three of these components at different times.

Still further, various examples of the sampling marker seeding component 503, pattern arrangement scoring component 505, and pattern arrangement selection component 507 may be embodied by a hardware device, such as a field programmable gate array (FPGA) system configured to implement the functionality of the coloring selection tool 501. As will be appreciated by those of ordinary skill in the art, conventional field programmable gate arrays contain memory and programmable logic blocks that can be configured to operate as simple logic gates (such as AND and XOR gates) or to perform more complex combinational functions. Field programmable gate arrays also contain a hierarchy of reconfigurable interconnects that allow the blocks to be wired together in different configurations. Thus, some examples of the coloring selection tool 501 may be embodied by using field programmable gate arrays configured to have combinatorial logic circuits that perform the functionality of the sampling marker seeding component 503, the pattern arrangement scoring component 505, or the pattern arrangement selection component 507 as described in more detail below. Still further, some examples of the sampling marker seeding component 503, the pattern arrangement scoring component 505, the pattern arrangement selection component 507, or some combination thereof may be embodied by an application-specific integrated circuit (ASIC) configured to perform aspects of the functionality of those tools.

The layout design database 509 may be implemented using any non-transitory storage device operable with the coloring selection tool 501. For example, the layout design database 509 may be implemented by microcircuit memory devices, such as read-write memory (RAM), read-only memory (ROM), electronically erasable and programmable read-only memory (EEPROM) or flash memory microcircuit devices, CD-ROM disks, digital video disks (DVD), or other optical storage devices. The layout design database 509 may also be implemented by magnetic cassettes, magnetic tapes, magnetic disks or other magnetic storage devices, punched media, holographic storage devices, or any combination of the foregoing devices.

Figure 6:
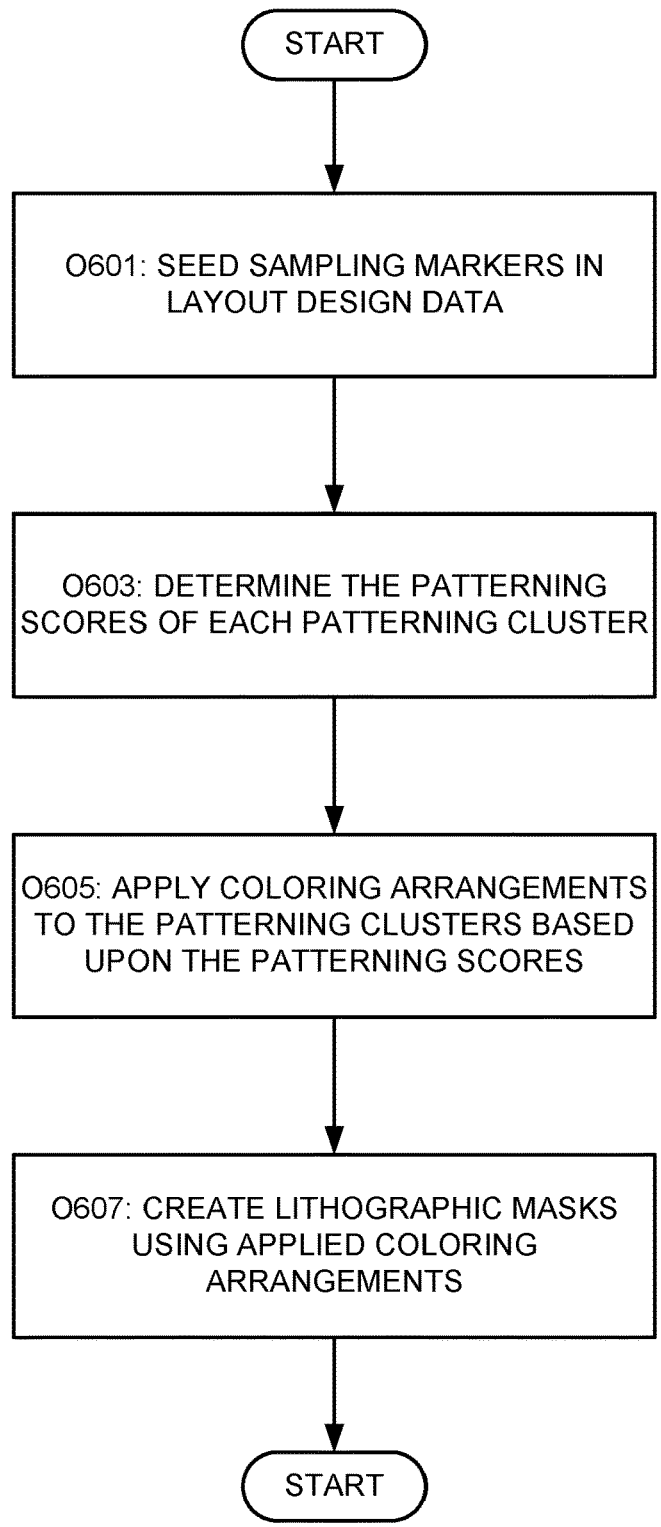
FIG. 6 illustrates a process for assigning coloring arrangements to patterning clusters in layout design data.

FIG. 6 illustrates a flowchart showing a process for assigning coloring arrangements to patterning clusters in layout design data. While different aspects of this process will be described with reference to the coloring selection tool 501 shown in FIG. 5, it should be appreciated that various varies implementations of this method may be performed without using the specific coloring selection tool 501. Similarly, the coloring selection tool 501 may be used to implement alternate methods for assigning coloring arrangement to patterning clusters in layout design data.

Seeding of Sampling Markers

Turning now to FIG. 6, in operation O601, the sampling marker seeding component 503 seeds sampling markers in the layout design data. The layout design data, which may be obtained from the layout design database 511, can be for a design, such as a design for an integrated circuit, a portion of an integrated circuit, or multiple integrated circuits. With various implementations, the sampling marker seeding component 503 seeds the layout design data by placing a sampling marker in one geometric element of each patterning cluster portion or patterning cluster in each cell.

Figure 7:
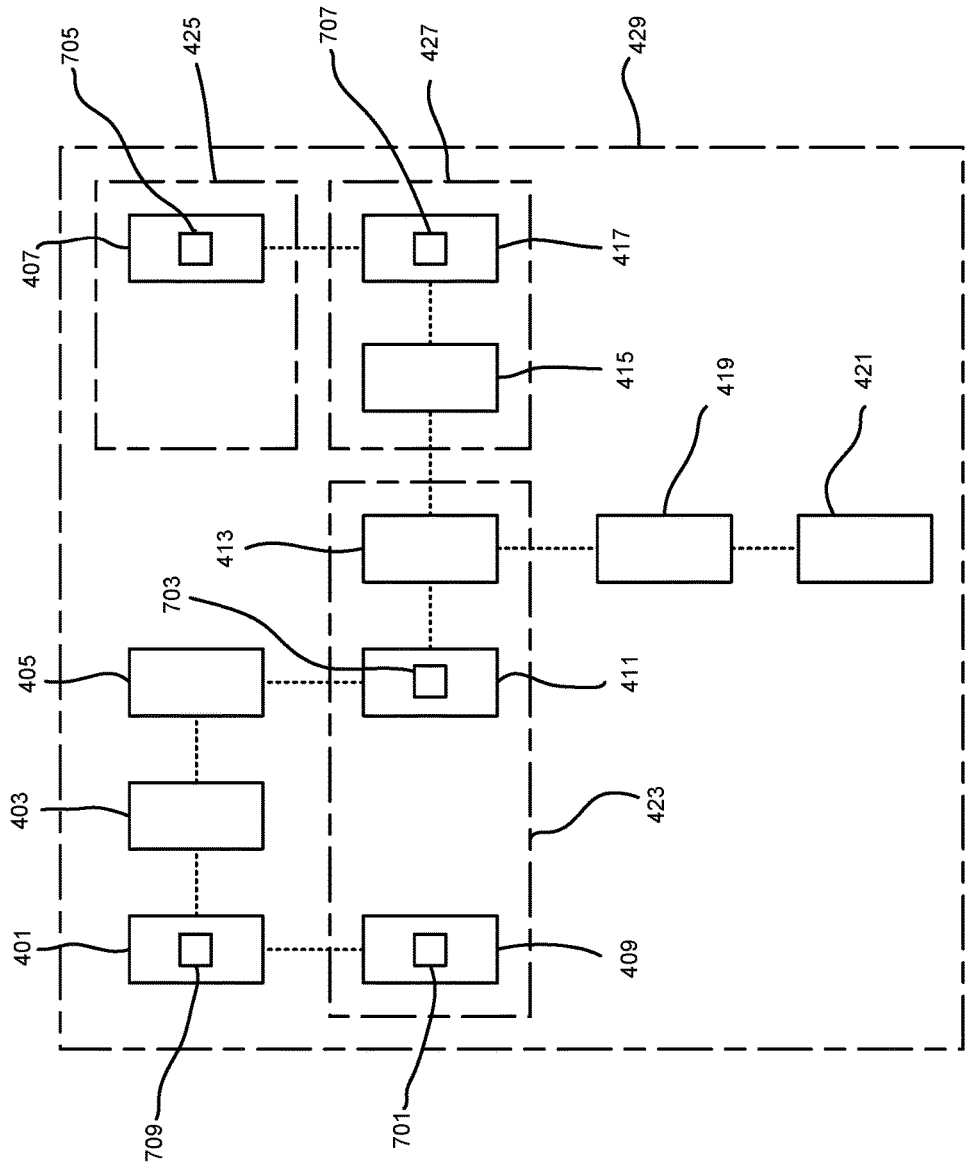
FIG. 7 illustrates an example of how sampling markers may be located in the patterning cluster shown in FIG. 4.

For example, referring to FIG. 7 (which illustrates the geometric elements 401-421 shown in FIG. 4), the sampling marker seeding component 503 would locate two sampling markers in hierarchical cell 423, one in each patterning clustering portion. Thus, in the illustrated example, the sampling marker seeding component 503 places a sampling marker 701 in geometric element 409, and places another sampling marker 703 in either geometric element 411 or geometric element 413 (in the illustrated example, in the geometric element 411), corresponding to hierarchical cell 423. Similarly, the sampling marker seeding component 503 places a sampling marker 705 in geometric element 407, corresponding to hierarchical cell 425. The sampling marker seeding component 503 also places a sampling marker 707 in either the geometric element 415 or the geometric element 417 (in the illustrated example, in the geometric element 417), corresponding to hierarchical cell 427. Still further, the sampling marker seeding component 503 also places a sampling marker 709 in a geometric element corresponding to hierarchical cell 429. The sampling marker seeding component 503 may place the sampling marker 709 in any of geometric elements 401-421, as they are all part of the single patterning cluster in the highest level hierarchical cell 429. In the illustrated example, the sampling marker 709 is located in the geometric element 401.

With various implementations of the invention, placement of a sampling marker in a hierarchical cell will be replicated in all instances of that cell. Thus, if the sampling marker 707 is placed in the geometric element 417 of the hierarchical cell 427, then the sampling marker 707 will be located in the geometric element 417 of all instances of the hierarchical cell 427. With various implementations of the coloring selection tool 501, a sampling marker may be any object that can be used to mark a geometric element. For example, with some implementations, the sampling markers may be pointers in a table or other data structure that are created to point to a selected geometric element. Alternately, the sampling markers may themselves be geometric elements that are overlaid onto the selected geometric elements.

Also, with various implementations, the patterning clusters and patterning cluster portions will be identified using graph techniques and identified using set designations. For example, with some implementations, the geometric elements will be treated as nodes of a graph, and constraints between two geometric elements will be considered edges between the constrained geometric elements. In this manner, a graphs will created for each patterning cluster portion (and patterning cluster) within a hierarchical cell. Once the geometric elements within a patterning cluster portion or patterning cluster have been identified, they are organized into sets that can be easily used by the sampling marker seeding component 503 to identify candidate geometric elements for receiving a sampling marker.

It should further be appreciated that, while one technique for seeding the layout design data with sampling markers has been described, any desired alternate technique also may be employed. For example, with some implementations, the sampling marker seeding component 503 may seed the layout design with sampling markers at random. Still further, as will be from the discussion below, if the coloring arrangement of some hierarchical cells is more important than others, then the sampling marker seeding component 503 may place more sampling markers in the important cells than in the unimportant cells.

Determination of Patterning Scores

Figure 8:
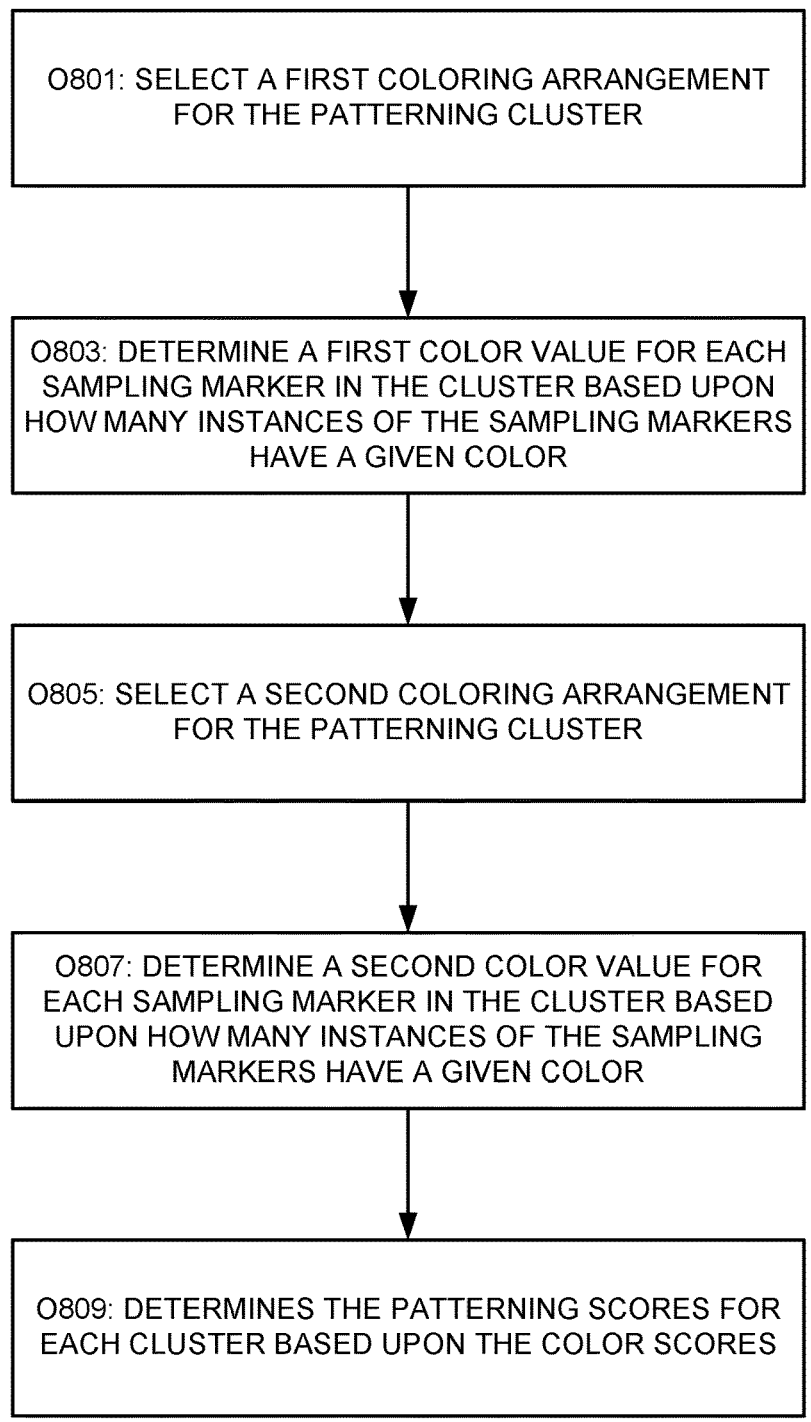
FIG. 8 illustrates a flowchart showing an example of how the patterning scores of patterning clusters may be determined.
Figure 9A:
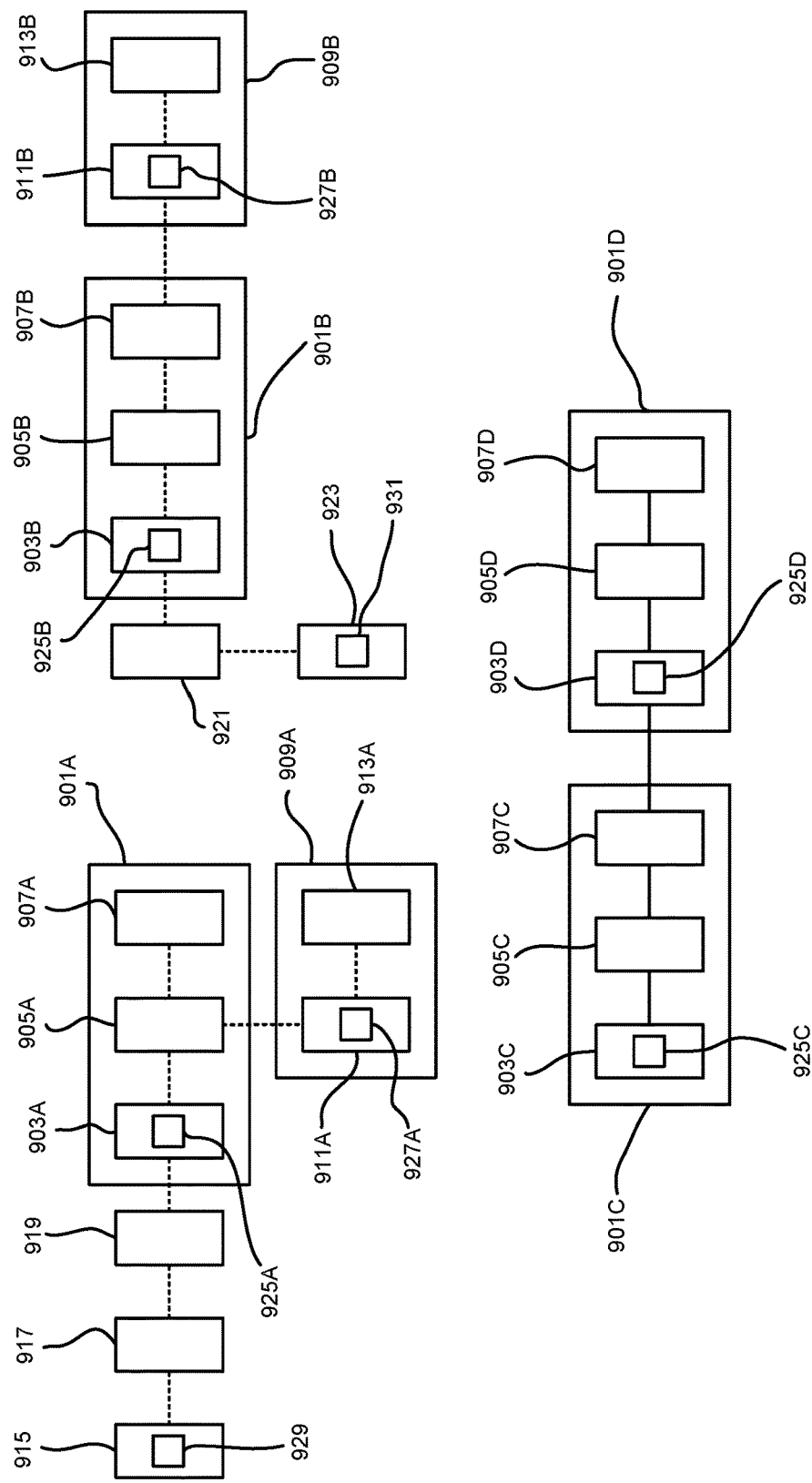
FIGS. 9A-9C illustrate layout design data with three patterning clusters and two coloring arrangements that might be applied to those patterning cluster in a double-patterning technique.

In operation O603, the patterning scores of each patterning cluster are determined. One example of this process will be explained with reference to the flowchart illustrated in FIG. 8 and the sampling clusters shown in FIG. 9A. As seen in this figure, FIG. 9A shows four placements of a first hierarchical cell 901 (i.e., 901A, 901B, and 901), each containing a placement of geometric elements 903, 905, and 907. For this cell, a sampling marker 925 has been placed in geometric element 903 according to the sampling marker seeding techniques described in detail above. FIG. 9A also shows two placements of a second hierarchical cell 909 (i.e., 909A and 909B), each containing a placement of geometric elements 911 and 913. For this cell, a sampling marker 927 has been placed in geometric element 903 according to the sampling marker seeding techniques described in detail above.

FIG. 9A shows three patterning clusters. The first patterning cluster is made up of a placement 901A of the first hierarchical cell, a placement 909A of the second hierarchical cell, and geometric elements 915-919. A sampling marker 929 is located in the geometric element 915. The second patterning cluster is made up of a placement 901B of the first hierarchical cell, a placement 909B of the second hierarchical cell, and geometric elements 921 and 923. A sampling marker 931 is located in the geometric element 923. Lastly, the third patterning cluster contains two placements of the first hierarchical cell 901C and 901D, with instances of the sampling marker 925 located in the instances of the geometric element 903 as previously noted.

Figure 9B:
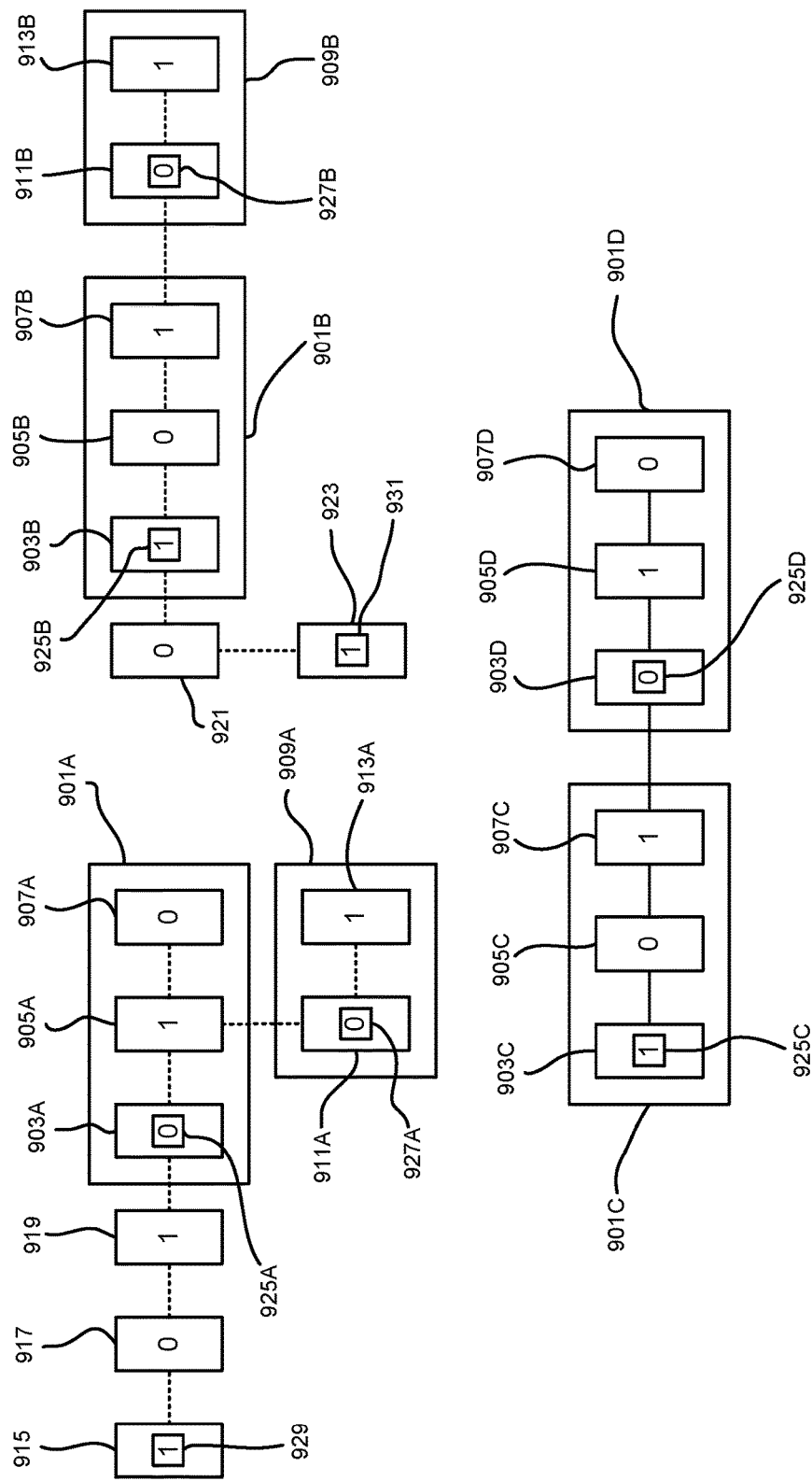

Initially, in operation O801, the pattern arrangement scoring component 505 selects an initial coloring arrangement for a patterning cluster. For example, the pattern arrangement scoring component 505 may select a coloring arrangement for the first cluster that assigns a color of "1" to geometric element 915. With a double-patterning coloring scheme, this coloring arrangement would then have the remaining geometric elements assigned corresponding colors of "0" or "1" as shown in FIG. 9B.

Similarly, the pattern arrangement scoring component 505 may select an initial coloring arrangement for the second cluster that assigns a color of "1" to geometric element 923, and an initial coloring arrangement for the third cluster that assigns a color of "1" to geometric element 925C. With a double-patterning coloring scheme, these coloring arrangements would then have the remaining geometric elements assigned corresponding colors of "0" or "1" as shown in FIG. 9B. It should be appreciated that the initial coloring arrangement for a cluster may be selected using any desirable criteria. For example, with some implementations, the initial coloring arrangement may be selected by performing a conventional coloring technique on the layout design data, and then employing the results of this conventional coloring technique as the initial coloring arrangement for the clusters. Alternately, the initial coloring arrangement may be selected by designating the hierarchically highest level geometric element with a sampling marker a defined color (e.g., "0"), and then coloring the remaining geometric elements based upon this designation.

Next, in operation O803, the pattern arrangement scoring component 505 determines a first color value for each sampling marker in a cluster based upon how many instances of the sampling markers have a given color with the first coloring arrangement. For example, the sampling marker 925 may be designated to have a given color of "0," the sampling marker 927 may be designated to have a given color of "0," the sampling marker 929 may be designated to have a given color of "1," and the sampling marker 931 may be designated to have a given color of "1." These values are shown as follows:

Sampling marker 925→Given color of "0"
Sampling marker 927→Given color of "0"
Sampling marker 929→Given color of "1"
Sampling marker 931→Given color of "1"

As discussed herein, the color of an instance of a sampling marker will be the same color as the geometric element associated with the sampling marker. Thus, in FIG. 9B, the sampling marker 919 will have a color of "1" because the geometric element 915 has a color of "1."

It should be noted that the given colors assigned to the sampling markers may be determined using any desirable criteria. For example, with some implementations, the given colors may be based upon performing a conventional coloring technique on the layout design data. The majority color for each sampling marker could then be designated as the given color for that sampling marker. Thus, in the above example, if a conventional coloring process assigned 100 instance of the sampling marker 925 (i.e., instances of the geometric element 903) with a color of "1," and assigned only 20 instance of the sampling marker 925 with a color of "0," then the given color for the sampling marker 925 would be "1." Of course, still other techniques for designating the given color of a sampling marker may be employed. For example, the given color of all sampling markers may be designated as a specific color, such as "1." In still other implementations, a designer may assign a given color to one or more sampling markers at random, or for any design-based reason. As will be apparent from the following discussion, with various implementations of the invention, the given color for a sampling marker will be the color associated with a preferred coloring arrangement to improve uniformity of coloring arrangements across multiple instances of hierarchical cells.

Returning now to the example described above, the first patterning cluster will have a first color value of 1 for the sampling marker 929, as one instance of the sampling marker 929 has been assigned the given color of "1." The first patterning cluster will have a first color value of 1 for the sampling marker 925, as one instance of the sampling marker 925 has been assigned the given color of "0," and it will have a first color value of 1 for the sampling marker 927, as one instance of the sampling marker 927 has been assigned the given color of "0."

For the second patterning cluster, it will have a first color value of 1 for the sampling marker 931, as one instance of the sampling marker 931 has been assigned the given color of "1." The second patterning cluster will have a first color value of 0 for the sampling marker 925, as no instances of the sampling marker 925 in the second patterning cluster has been assigned the given color of "0." It will have a first color value of 1 for the sampling marker 927, as one instance of the sampling marker 927 has been assigned the given color of "0." The third patterning cluster will have a first color value of 1 for the sampling marker 925, as only one instance of the sampling marker 925 has been assigned the given color of "0."

Figure 9C:
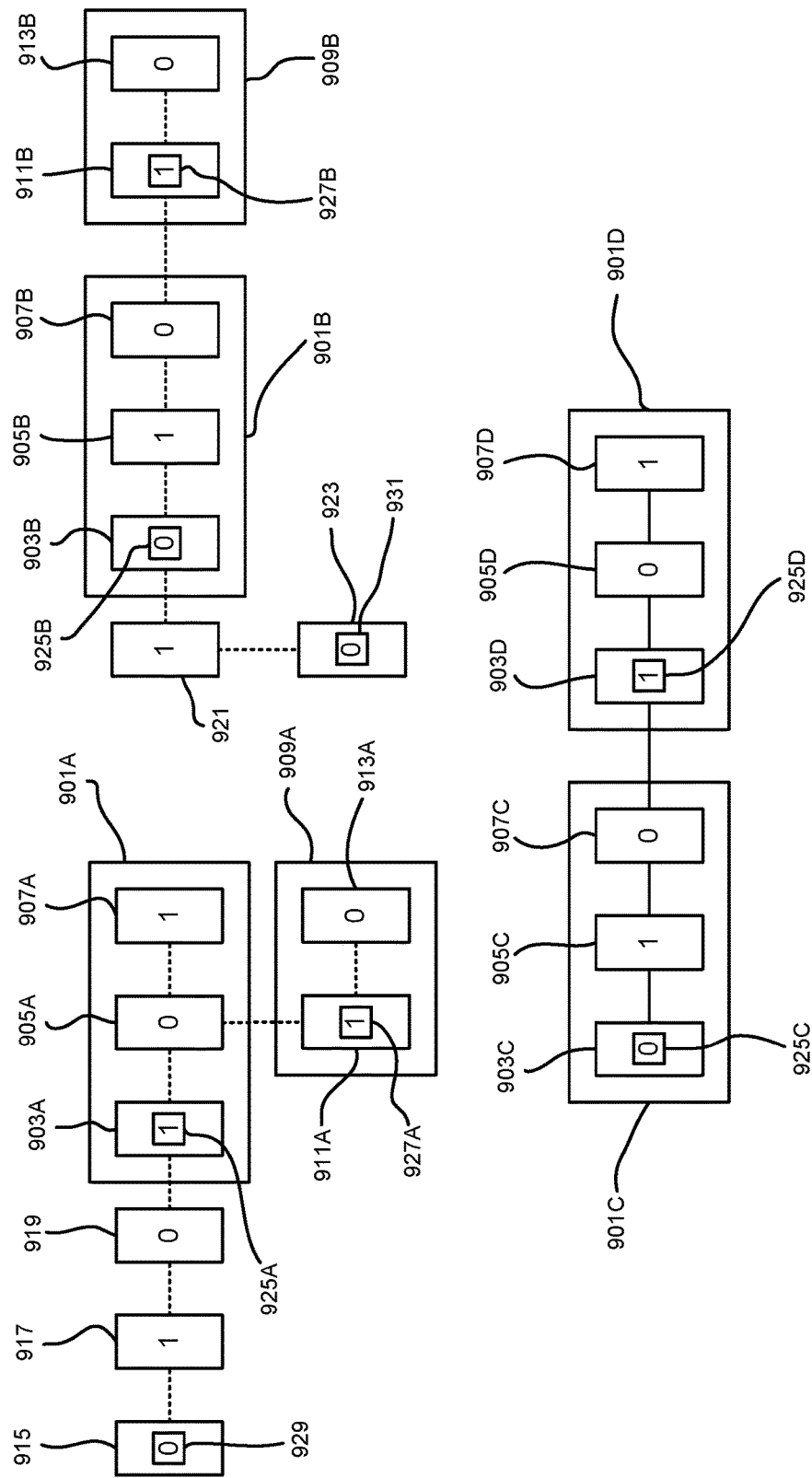

Next, in operation O805, the pattern arrangement scoring component 505 selects a second coloring arrangement for a patterning cluster. With a double-patterning technique, the pattern arrangement scoring component 505 will select a second coloring arrangement for each patterning cluster that is the opposite of the first coloring arrangement. Thus, the pattern arrangement scoring component 505 will select a coloring arrangement for the first cluster that assigns a color of "0" to geometric element 915, and the remaining geometric elements corresponding colors of "0" or "1" as shown in FIG. 9C.

In operation O807, the pattern arrangement scoring component 505 determines a second color value for each sampling marker in a cluster based upon how many instances of the sampling markers have a given color with the second coloring arrangement. Thus, with the example shown in FIG. 9C, the first patterning cluster will have a second color value of 0 for the sampling marker 929, as no instances of the sampling marker 929 have been assigned the given color of "1." The first patterning cluster also will have a second color value of 0 for the sampling marker 925, as no instances of the sampling marker 925 have been assigned the given color of "0" in the first cluster. The first cluster then will have a second color value of 0 for the sampling marker 927, as no instances of the sampling marker 927 have been assigned the given color of "0" in first patterning cluster.

For the second patterning cluster, it will have a second color value of 0 for the sampling marker 931, as no instances of the sampling marker 931 have been assigned the given color of "1." The second patterning cluster will have a second color value of 1 for the sampling marker 925, as one instance of the sampling marker 925 in the second patterning cluster has been assigned the given color of "0." It will have a second color value of 0 for the sampling marker 927, as no instances of the sampling marker 927 have been assigned the given color of "0." The third patterning cluster will have a second color value of 1 for the sampling marker 925, as one instance of the sampling marker 925 has been assigned the given color of "0."

It should be appreciated that, while a simple scoring function has been described above, a variety of alternate scoring techniques can be employed. For example, for a particular design, it may be more important to maintain coloring uniformity for a one hierarchical cell than another hierarchical cell. In this situation, the color values of the sampling markers in that first hierarchical cell may be weighted more than the color values of the sampling markers in the second hierarchical cell. For example, the value of each instance of the sampling markers in the first hierarchical cell having their given colors may be scored with a value of 5, while the value of each instance of the sampling markers in the first hierarchical cell having their given colors may be scored with a value of 1. Alternately, an additional fixed weight (e.g., 3) may be added to the color values of the first hierarchical cell, or the color values of the first hierarchical cell may be squared or cubed, etc. (Also, as noted above, the significance of a hierarchical cell may be increased by adding additional sampling markers into the cell.) As will be appreciated by those of ordinary skill in the art, any desired scoring function can be used to determine the color values for the sampling markers.

In operation O809, the pattern arrangement scoring component 505 determines the patterning scores for each cluster based upon the color scores. With various implementations, the pattern arrangement scoring component 505 may simply add the color scores determined for each coloring arrangement. For example, as discussed above, the first patterning cluster shown in FIG. 9A has a first color value of 1 for the sampling marker 929, a first color value of 1 for the sampling marker 925, and a first color value of 1 for the sampling marker 927, for an additive total of 3 for the first coloring arrangement. The first patterning cluster also has a second color value of 0 for the sampling marker 929, a second color value of 0 for the sampling marker 925, and a second color value of 0 for the sampling marker 927, for an additive total value of 0 for the second color arrangement. Thus, for the first patterning cluster, the pattern arrangement scoring component 505 will assign a first patterning score of 3 and a second patterning score of 0.

Similarly, the second patterning cluster will have a first color value of 1 for the sampling marker 931, a first color value of 0 for the sampling marker 925, and a first color value of 1 for the sampling marker 927, for an additive total value of 2 for the first color arrangement. The second patterning cluster will have a second color value of 0 for the sampling marker 931, a second color value of 1 for the sampling marker 925, and a second color value of 0 for the sampling marker 927, for a total additive value of 1 for the second color arrangement. Thus, for the second patterning cluster, the pattern arrangement scoring component 505 will assign a first patterning score of 2 and a second patterning score of 1.

With regard to the third patterning cluster, the pattern arrangement scoring component 505 will assign a value of 1 for both the first patterning score and the second pattern score, as the cumulative color value for the sampling markers in the third patterning cluster is 1 for both the first coloring arrangement and the second coloring arrangement.

Thus, the patterning scores for the patterning clusters shown in FIGS. 9A-9C will be as follows:

TABLE 1

|  | First Patterning Cluster | Second Patterning Cluster | Third Patterning Cluster |
| --- | --- | --- | --- |
| First Coloring Arrangement | 3 | 2 | 1 |
| Second Coloring Arrangement | 0 | 1 | 1 |

Again, while the determination of the patterning scores have been described with respect to a simple additive function, still other techniques can be employed to determine the patterning score from the coloring scores. For example, some designs may require a bias toward a particular coloring arrangement for some hierarchical cells or patterning clusters. In these situations, the patterning scores corresponding to the biased coloring arrangement may be weighted more than the patterning scores for other coloring arrangements. For example, the patterning scores for a biased coloring arrangement may be multiplied by a weighting value of 2. Alternately, an additional fixed weight (e.g., 4) may be added to the patterning scores of the biased coloring arrangement. As will be appreciated by those of ordinary skill in the art, any desired scoring function can be used to determine the patterning scores for each patterning cluster.

Also, while various operations have been described above with respect to double patterning, it should be appreciated that these operations also can be applied to triple patterning and higher multiple patterning alternatives. For example, with a triple patterning technique, after determining the color values of the sampling markers for a second coloring arrangement, the pattern arrangement scoring component 505 will determine the color values of the sampling markers for a third coloring arrangement different from the first and second coloring arrangements. Similarly, the pattern arrangement scoring component 505 will use these additional color values to determine a patterning score for each patterning cluster corresponding to the third coloring arrangement.

Returning now to FIG. 6, in operation O605, the pattern arrangement selection component 507 applies coloring arrangements to the patterning clusters based upon the patterning scores. With various implementations, the pattern arrangement selection component 507 will determine the color arrangement for a patterning cluster based upon a comparison of the patterning scores. For example, with respect to the patterning clusters shown in FIGS. 9A-9C, the pattern arrangement selection component 507 will select the first coloring arrangement for the first patterning cluster, because its first patterning score of 3 is higher than its second patterning score of 0. Likewise, the pattern arrangement selection component 507 will select the first coloring arrangement for the second patterning cluster, because its first patterning score of 2 is higher than its second patterning score of 1.

For the third patterning cluster, the pattern arrangement selection component 507 may select either the first coloring arrangement or the second coloring arrangement, as both arrangements produce the patterning scores. With various implementations, the pattern arrangement selection component 507 may employ some time of tie-breaking rule to determine a coloring arrangement for patterning clusters that do not have a highest patterning score, such as the third patterning cluster shown in FIGS. 9A-9C. The pattern arrangement selection component 507 may, for example, keep the patterning cluster at an initial coloring arrangement determined by a conventional coloring technique, designate that all "tying" patterning clusters be assigned to the second coloring arrangement by default, or employ some other type of heuristic to determine the coloring arrangement.

It should be appreciated that, with different implementations, the pattern arrangement scoring component 505 may alternately or additionally use other techniques for determining which coloring arrangement to apply to a patterning cluster. For example, some implementations of the pattern arrangement selection component 507 may evaluate a ratio of the first patterning score to the second patterning score. Still further, some implementations of the pattern arrangement selection component 507 may apply a default coloring arrangement (for example, an initial coloring arrangement created by a conventional double patterning coloring technique) unless the patterning score for one coloring arrangement exceeds the patterning score for the default coloring arrangement by a predetermined amount. Of course, still other techniques for determining which coloring arrangement to apply to the patterning clusters based upon their respective patterning scores may be employed. Also, as previously noted, the operation of selecting and applying a coloring arrangement based upon the patterning scores may be applied to triple patterning and higher multiple patterning techniques.

Once the pattern arrangement selection component 507 has selected and applied a coloring arrangement for each patterning cluster in the layout design data, in operation O607 complementary lithographic masks can be manufactured from the layout design data. As will be appreciated by those of ordinary skill in the art, the physical features of the complementary lithographic masks will be correspond to the coloring arrangements applied by the pattern arrangement selection component 507 to the layout design data.

CONCLUSION

While the technology disclosed herein has been described with respect to specific examples, including presently preferred modes, those skilled in the art will appreciate that there are numerous variations and permutations of the above described systems and techniques that fall within its spirit and scope as set forth in the appended claims. For example, while specific terminology has been employed above to refer to electronic design automation processes, it should be appreciated that various examples of the technology may be implemented using any desired combination of electronic design automation processes.

What is claimed is:

1. A method comprising:
by a computing system:
seeding sampling markers on selected geometric elements of multiple patterning clusters in layout design data that represents an integrated circuit, including by, for a common cell placed at multiple instances in the layout design data:
placing an instance of a given sampling marker on the same geometric element in each instance of the common cell;
determining patterning scores for each of the multiple patterning clusters respectively, including by:
assigning a given color for each of the sampling markers seeded in the multiple patterning clusters;
selecting a first color arrangement for the multiple patterning clusters in the layout design data;
determining a respective first color value for each instance of the sampling markers for the first color arrangement, the first color value indicative of whether an instance of a particular sampling marker for the first color arrangement matches the given color assigned to the particular sampling marker;
selecting a second color arrangement for the multiple patterning clusters in the layout design data;
determining a respective second color value for each instance of the sampling markers for the second color arrangement, the second color value indicative of whether an instance of a particular sampling marker for the second color arrangement matches the given color assigned to the particular sampling marker; and
for each given patterning cluster of the multiple clusters:
determining a first patterning score for the given patterning cluster as a function of the first color values of each instance of the sampling markers in the given patterning cluster; and
determining a second patterning score for the given patterning cluster as a function of the second color values of each instance of the sampling markers in the given patterning cluster; and
coloring the layout design data by applying the first color arrangement or the second color arrangement to each given patterning cluster of the multiple patterning clusters based on the first and second patterning scores of the given patterning cluster; and
manufacturing a complementary lithographic mask according to the coloring applied to the colored layout design data.

2. The method of claim 1, wherein determining the first patterning score for the given patterning cluster comprises adding together the first color values of each instance of the sampling markers in the given patterning cluster; and
wherein determining the second patterning score for the given patterning cluster comprises adding together the second color values of each instance of the sampling markers in the given patterning cluster.

3. The method of claim 1, wherein determining the first patterning score for the given patterning cluster comprises:
performing a weighed addition on the first color values of each instance of the sampling markers in the given patterning cluster together such that the first color values of sampling markers located in a particular hierarchical cell are weighted higher than first color values of sampling markers located in a different hierarchical cell; and
wherein determining the second patterning score for the given patterning cluster comprises:
performing the weighed addition on the second color values of each instance of the sampling markers in the given patterning cluster together such that the second color values of sampling markers located in the particular hierarchical cell are weighted higher than second color values of sampling markers located in the different hierarchical cell.

4. The method of claim 1, wherein seeding the sampling markers on selected geometric elements of the multiple patterning clusters comprises, for each given patterning cluster of the multiple patterning clusters:
placing a sampling marker on a single geometric element in each pattern clustering portion in the given patterning cluster, wherein each patterning clustering portion includes a set of geometric elements interconnected by coloring constraints.

5. The method of claim 1, wherein applying the first color arrangement or the second color arrangement to each given patterning cluster of the multiple patterning clusters based on the first and second patterning scores of the given patterning cluster comprises:
determining to apply a color arrangement with a higher patterning score.

6. The method of claim 1, wherein assigning the given color for each of the sampling markers seeded in the multiple patterning clusters comprises:
applying a coloring technique on the layout design data; and
for each given sampling marker, assigning the given color for the given sampling marker as a color that occurs the most among instances of the given sampling marker upon application of the applied coloring technique.

7. The method of claim 1, wherein selecting the first color arrangement for the multiple patterning clusters in the layout design data comprises:

identifying a geometric element seeded with a sampling marker and that is on the hierarchically highest level of a hierarchy among cells in the layout design data;

designating a particular color for the identified geometric element; and coloring, for the first color arrangement, remaining geometric elements based on the particular color designated for the identified geometric element.

8. A non-transitory machine-readable medium storing instructions that, when executed by a processor, causes a computing system to:

seed sampling markers on selected geometric elements of multiple patterning clusters in layout design data that represents an integrated circuit, including by, for a common cell placed at multiple instances in the layout design data:

placing an instance of a given sampling marker on the same geometric element in each instance of the common cell;

determine patterning scores for each of the multiple patterning clusters respectively, including by:

assigning a given color for each of the sampling markers seeded in the multiple patterning clusters;

selecting multiple color arrangements for the multiple patterning clusters;

determining multiple color values for each instance of the sampling markers, each respective color value for one of the multiple color arrangements; and for each given patterning cluster of the multiple clusters:

determining multiple patterning scores for the given patterning cluster, each patterning score applicable to a given color arrangement and determined as a function of color values determined for each instance of the sampling markers in the given patterning cluster for the given color arrangement; and color the layout design data by applying a selected one of the multiple color arrangements to each given patterning cluster of the multiple patterning clusters, the applied color arrangement selected based on the multiple patterning scores determined for the given patterning cluster, wherein the colored layout design data supports manufacture of complementary lithographic masks according to the coloring applied to the colored layout design data.

9. The non-transitory machine-readable medium of claim 8, wherein the instructions cause the computing system to determine, for each given patterning cluster of the multiple clusters, a patterning score applicable to a given color arrangement by:

adding together the color values of each instance of the sampling markers in the given patterning cluster for the given color arrangement.

10. The non-transitory machine-readable medium of claim 8, wherein the instructions cause the computing system to determine, for each given patterning cluster of the multiple clusters, a patterning score applicable to a given color arrangement by:

performing a weighted addition of the color values of each instance of the sampling markers in the given patterning cluster for the given color arrangement such that the color values of sampling markers located in a particular hierarchical cell are weighted higher than the color values of sampling markers located in a different hierarchical cell.

11. The non-transitory machine-readable medium of claim 8, wherein the instructions cause the computing system to seed the sampling markers on selected geometric elements of the multiple patterning clusters by, for each given patterning cluster of the multiple patterning clusters:

placing a sampling marker on a single geometric element in each pattern clustering portion in the given patterning cluster, wherein each patterning clustering portion includes a set of geometric elements interconnected by coloring constraints.

12. The non-transitory machine-readable medium of claim 8, wherein the instructions cause the computing system to apply the selected one of the multiple color arrangements to each given patterning cluster of the multiple patterning clusters based on the multiple patterning scores determined for the given patterning cluster:

determining to apply a color arrangement among the multiple color arrangements with the highest patterning score.

13. The non-transitory machine-readable medium of claim 8, wherein the instructions cause the computing system to assign the given color for each of the sampling markers seeded in the multiple patterning clusters by:

applying a coloring technique on the layout design data; and for each given sampling marker, assigning the given color for the given sampling marker as a color that occurs the most among instances of the given sampling marker upon application of the applied coloring technique.

14. The non-transitory machine-readable medium of claim 8, wherein the instructions cause the computing system to select an initial color arrangement among the multiple color arrangements by:

identifying a geometric element seeded with a sampling marker and that is on the hierarchically highest level of a hierarchy among cells in the layout design data;

designating a particular color for the identified geometric element; and coloring, for the initial color arrangement, remaining geometric elements based on the particular color designated for the identified geometric element.

15. A system comprising:

a sampling marker seeding component to seed sampling markers on selected geometric elements of multiple patterning clusters in layout design data that represents an integrated circuit, including by, for a common cell placed at multiple instances in the layout design data:

placing an instance of a given sampling marker on the same geometric element in each instance of the common cell;

a pattern arrangement scoring component to determine patterning scores for each of the multiple patterning clusters respectively, including by:

assigning a given color for each of the sampling markers seeded in the multiple patterning clusters;

selecting multiple color arrangements for the multiple patterning clusters;

determining multiple color values for each instance of the sampling markers, each respective color value for one of the multiple color arrangements; and for each given patterning cluster of the multiple clusters:

determining multiple patterning scores for the given patterning cluster, each patterning score applicable to a given color arrangement and determined as a function of color values determined for each instance of the sampling markers in the given patterning cluster for the given color arrangement; and a pattern arrangement selection component to color the layout design data by applying a selected one of the multiple color arrangements to each given patterning cluster of the multiple patterning clusters, the applied color arrangement selected based on the multiple patterning scores determined for the given patterning cluster, wherein the colored layout design data supports manufacture of complementary lithographic masks according to the coloring applied to the colored layout design data.

16. The system of claim 15, wherein the pattern arrangement scoring component is to determine, for each given patterning cluster of the multiple clusters, a patterning score applicable to a given color arrangement by:

adding together the color values of each instance of the sampling markers in the given patterning cluster for the given color arrangement.

17. The system of claim 15, wherein the pattern arrangement scoring component is to determine, for each given patterning cluster of the multiple clusters, a patterning score applicable to a given color arrangement by:

performing a weighted addition of the color values of each instance of the sampling markers in the given patterning cluster for the given color arrangement such that the color values of sampling markers located in a particular hierarchical cell are weighted higher than the color values of sampling markers located in a different hierarchical cell.

18. The system of claim 15, wherein the sampling marker seeding component is to seed the sampling markers on selected geometric elements of the multiple patterning clusters by, for each given patterning cluster of the multiple patterning clusters:

placing a sampling marker on a single geometric element in each pattern clustering portion in the given patterning cluster, wherein each patterning clustering portion includes a set of geometric elements interconnected by coloring constraints.

19. The system of claim 15, wherein the pattern arrangement scoring component is to assign the given color for each of the sampling markers seeded in the multiple patterning clusters by:

applying a coloring technique on the layout design data; and for each given sampling marker, assigning the given color for the given sampling marker as a color that occurs the most among instances of the given sampling marker upon application of the applied coloring technique.

20. The system of claim 15, wherein the pattern arrangement scoring component is to select an initial color arrangement among the multiple color arrangements by:

identifying a geometric element seeded with a sampling marker and that is on the hierarchically highest level of a hierarchy among cells in the layout design data;

designating a particular color for the identified geometric element; and coloring, for the initial color arrangement, remaining geometric elements based on the particular color designated for the identified geometric element.

* * * * *